United States Patent [19]

Mueller et al.

[11] Patent Number: 5,126,830
[45] Date of Patent: Jun. 30, 1992

[54] CRYOGENIC SEMICONDUCTOR POWER DEVICES

[75] Inventors: Otward M. Mueller, Ballston Lake; Lowell S. Smith, Schenectady, both of N.Y.

[73] Assignee: General Electric Company, Schenectady, N.Y.

[21] Appl. No.: 429,532

[22] Filed: Oct. 31, 1989

[51] Int. Cl.[5] .............................................. H01L 39/02
[52] U.S. Cl. .......................................... 357/83; 357/80
[58] Field of Search ............................... 357/83, 80, 81

[56] References Cited

U.S. PATENT DOCUMENTS

| | | | |
|---|---|---|---|
| 4,472,727 | 9/1984 | Tewksburg | 357/83 |
| 4,608,582 | 8/1986 | Nishizawa | 357/55 |
| 4,734,820 | 3/1988 | Lauffer et al. | 357/83 |
| 4,965,659 | 10/1990 | Sasame et al. | 357/74 |
| 4,980,754 | 12/1990 | Kotani et al. | 357/83 |

FOREIGN PATENT DOCUMENTS

| | | | |
|---|---|---|---|
| 63-50046 | 3/1988 | Japan | 357/83 |
| 63-289974 | 11/1988 | Japan | 357/83 |

OTHER PUBLICATIONS

Rideout, "Close-Cycle Liquid Nitrogen Refrigeration System for Low-Temperature Computer Operation," Sep. 1975, *IBM Technical Disclosure Bulletin*, vol. 18, No. 4, pp. 1226–1229.

*Primary Examiner*—Jerome Jackson, Jr.
*Assistant Examiner*—Courtney Bowers
*Attorney, Agent, or Firm*—Donald S. Ingraham; James C. Davis, Jr.; Marvin Snyder

[57] ABSTRACT

A cryogenic solid-state semiconductor power device, has the actual device chip mounted on a substrate of a material of very high thermal conductivity, which is positioned in a a bath of cryogenic fluid. The substrate may be formed of beryllia, beryllium, alumina, aluminum nitride, diamond and the like materials.

12 Claims, 2 Drawing Sheets

CRYOGENIC SEMICONDUCTOR POWER DEVICES

The present invention relates to semiconductor power devices and, more particularly, to novel solid-state semiconductor power devices, such as metal-oxide-semiconductor field-effect transistors (MOSFETs), static induction transistors (SITs) and the like, for operation at cryogenic temperatures, such as in a bath of liquid nitrogen and the like coolants.

In many power generation applications, solid-state devices have replaced vacuum tubes. Due to the extremely high power density which occurs in the very small volume of most solid-state power devices (such as in the channel of a MOSFET), the reliability and life of the device can be shortened. While it is well known to minimize device power dissipation by using switch-mode and other high-efficiency methodologies, it is often difficult to provide for fast removal of the heat energy generated inside the device, as by dissipation of switching current in the on-resistance of a power MOSFET. While good thermal design is required, maximization of the thermal conductivity of the semiconductor material, and the substrate upon which the device chip is mounted, must be provided. A power device mounted and packaged for operation at cryogenic temperatures, to provide extremely high efficiency and very small size, is therefore highly desirable.

BRIEF SUMMARY OF THE INVENTION

In accordance with the invention, a solid-state semiconductor power device optimized for cryogenic applications has the actual device chip mounted on a substrate of a material of very high thermal conductivity, which is positioned in a bath of cryogenic fluid. The substrate may be formed of beryllia, beryllium, alumina, aluminum nitride, diamond and the like materials. The device can be a MOSFET, SIT and the like.

A presently preferred embodiment has a substrate disposed in a vertical plane, so that, if either or both of the chip-mounting surface and the rear substrate surface are bathed in the cryogenic cooling liquid, buildup of a low thermal-conductivity vapor barrier between the cryogenic liquid and the chip-supporting heat sink is prevented.

Accordingly, it is an object of the present invention to provide novel cryogenic solid-state semiconductor power devices for use in cryogenically-cooled electronic assemblies.

This and other objects of the present invention will become apparent upon reading of the following detailed description, when considered in conjunction with the associated drawings.

DETAILED DESCRIPTION OF THE INVENTION

Figure 1:
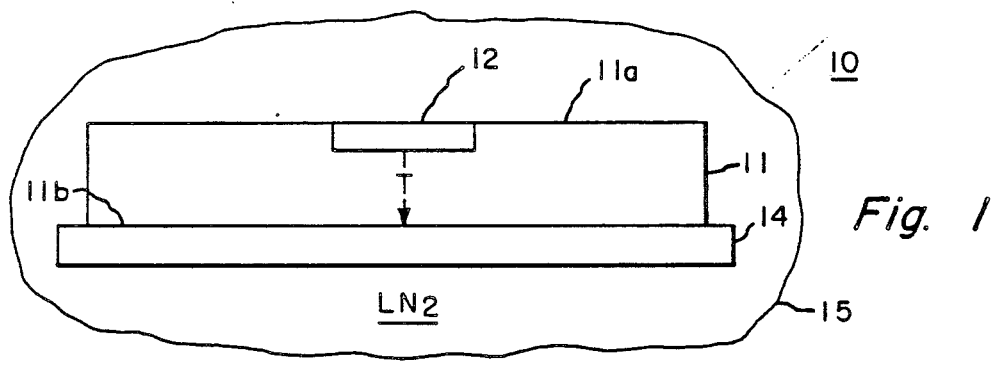
FIG. 1 is a side view of a basic cryogenically-cooled semiconductor power device, in accordance with the principles of the present invention.

Referring initially to FIG. 1, a cryogenically-coolable semiconductor power device 10 includes a heat sink member 11 having a first surface 11a upon which is mounted a solid-state semiconductor power device chip 12, and having a second surface 11b which may be mounted upon a thermally-conductive structural member 14, of copper and like material, to hold the semiconductor chip 12 and supporting thermally-conductive member 11 within a bath 15 of a cryogenic liquid, such as liquid nitrogen ($LN_2$) at a temperature of about 77° K. In a device for use at room temperature member 11 will consist of an electrically insulative material such as beryllia (BeO). Hence, the heat sink thickness T is made as small as possible relative to the thickness of member 14 as the thermal conductivity $\theta$ of the beryllia is less than the thermal conductivity of the member 14 material (say, Cu). At cryogenic temperatures (say, 77° K.), however, T is chosen to be much larger, as $\theta_{BeO}$ is greater than $\theta_{Cu}$. Advantageously, device 10 is disposed in a vertical plane, i.e. with both surfaces 11a and 11b vertically disposed, such that any vapor thermally agitated from the surrounding cryogenic liquid mass 15 does not collect about the device 10 and form a low-thermal-conductivity vapor barrier between device 10 and the surrounding coolant 15.

It is well known that the thermal conductivity of some substrate materials, such as alumina, diamond, beryllia and the like, tend to increase at cryogenic temperatures, and in fact may peak near the temperature (i.e. 77° K.) of liquid nitrogen. The thermal conductivity of conductors such as copper and aluminum and the like as well as of certain solid-state-device-forming semiconductor materials (such as silicon, germanium and the like) increase as temperatures are decreased well into the cryogenic region. Tests of MOSFET and SIT (static-induction-transistor) devices have shown that many important electronic properties improve dramatically in the cryogenic temperature regions. For example, the on-resistance of high voltage (200–1000 V) MOSFETs decreases by a factor of between about 10 and about 30, at liquid nitrogen temperatures, with respect to room temperature (e.g. 290° K.). The switching time, and therefore switching power loss, decrease, as the effect of parasitic capacities decrease with temperature. Therefore, speed increases, as well as transconductance, gain and maximum current, due to increased electron mobility. All such changes result in a lower-cost device for handling the same power levels.

Figure 3:
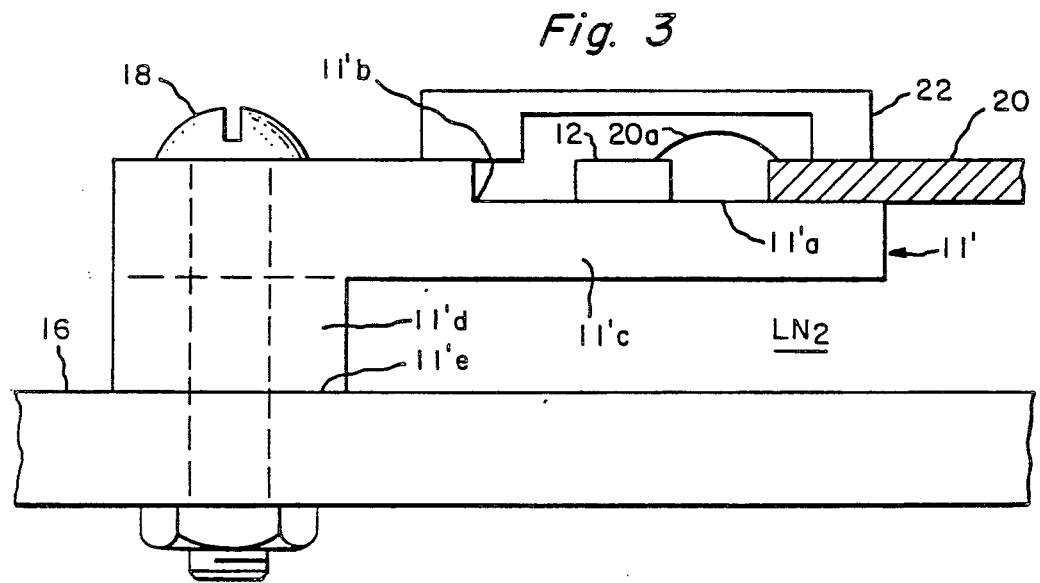
FIG. 3 is a sectional side view of one presently preferred cryogenic semiconductor power device mounting apparatus.

Another presently preferred apparatus 10' is shown in FIG. 3, wherein a generally L-shaped substrate member 11' of a high-thermal-conductivity, but electrically insulative, material, such as aluminum nitride, beryllium oxide and the like, has a first surface 11'a, which may be within a recessed portion 11'b and the like, upon which the power device chip 12 is mounted. Recess 11'b is formed upon a leg portion 11'c of the substrate, which also has a base portion 11'd extending at right angles to leg portion 11'c, so that a surface 11'e can be mounted against an insulative member 16. Securing means 18, such as an insulated screw and the like, can be utilized to fasten substrate 11' to member 16; advantageously, member 16 may be vertically disposed, and portion 11'd is a means for positioning the chip 12/substrate 11'c such that a vapor barrier does not build up between the coolant and the substrate. Alternatively, member 11' can be made of an electrically and thermally conductive material, such as beryllium, with member 16 being of a electrically-insulative material; part of the member (i.e. leg 11'c) can be of an electrically conductive material (Be) and another part (portion 11'd) of an insulative material (BeO). Electrical connections from device chip 12 to each of at least one conductive leads 20 can be made by known means, such as bonding wires 20a and the like. If desired, a cover member 22 can be placed over the semiconductor chip 12, to provide additional protection thereto. In use, a cryogenic agent, such as liquid nitrogen (LN$_2$) and the like contacts at least substrate 11', for withdrawal of dissipative thermal energy from device 12, through the high thermal-conductivity material of the supporting substrate.

Figure 4:
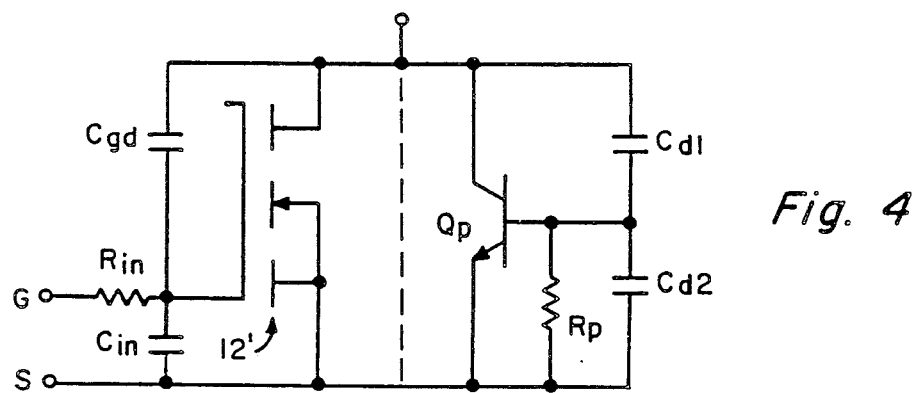
FIG. 4 is a schematic diagram of an equivalent circuit of a MOSFET, and useful in appreciating aspects of the present invention.
Figure 2:
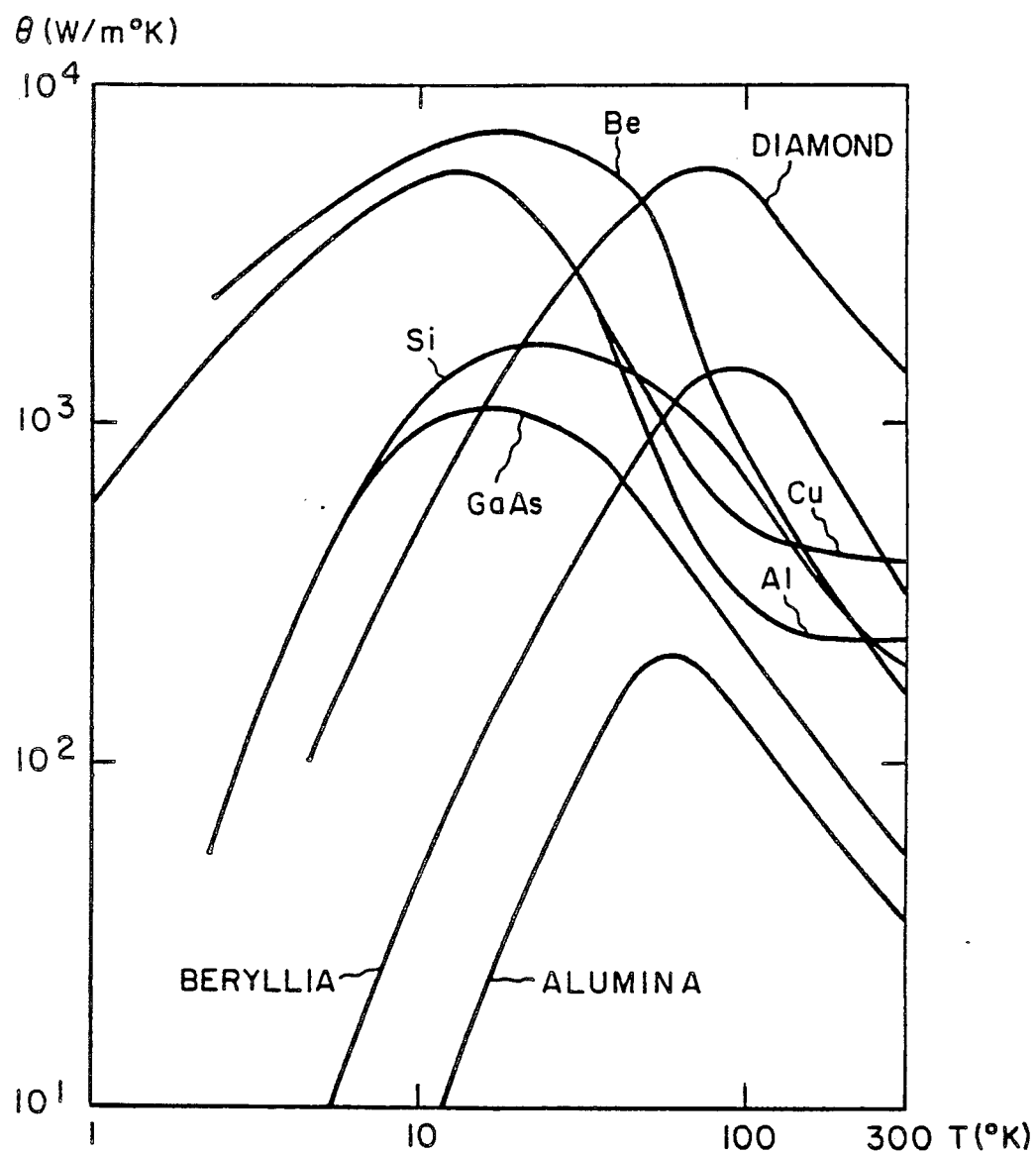
FIG. 2 is a graph illustrating the thermal conductivity of a number of materials, with respect to a range of cryogenic and room temperatures.

As previously stated, chip 12 may be a MOSFET, a SIT, or the like. FIG. 4 is a schematic diagram of an equivalent electrical circuit of a MOSFET. In addition to an ideal device 12' having an input capacitance $C_{in}$, an input resistance $R_{in}$ and a gate-drain capacitance $C_{gd}$, there is also a parasitic bipolar transistor $Q_p$, having its own base-emitter parasitic resistance $R_p$ and series-connected drain capacitances $C_{d1}$ and $C_{d2}$. Cryogenic Cooling reduces the undesirable effect of all of the parasitic elements, as well as increasing the speed and maximum current handling capability of device 12'.

While several presently preferred embodiments of our novel invention have been described in detail herein, many modifications and variations will now become apparent to those skilled in the art. It is our intent, therefore, to be limited only by the scope of the appended claims and not by the specific details and instrumentalities presented by way of explanation herein.

What is claimed is:

1. A device for use in a cryogenic environment, comprising:
   a semiconductor power device chip;
   a substrate having a surface on which said chip is mounted, said substrate being substantially surrounded by a mass of cryogenic fluid;
   said substrate consisting of an electrically but thermally conductive material having greater thermal conductivity at cryogenic temperatures than at room temperature;
   said substrate having a thickness selected for optimum dissipation, at cryogenic temperatures, of chip-generated heat, said last-recited thickness being greater than the substrate thickness selected for optimum heat dissipation for device operation at room temperature;
   said substrate further comprising a recess in said surface for holding said semiconductor power device chip and means for providing a protective covering for said chip;
   a structural member disposed within said mass of cryogenic fluid substantially parallel to said substrate; and
   means for increasing the heat dissipation of said substrate including a base portion connected between said substrate and said structural member for spacing said substrate from said structural member, said base portion being effective to increase the surface area of said substrate exposed to said cryogenic fluid.

2. The device of claim 1, wherein said substrate is oriented in said cryogenic mass by said base portion to minimize the collection of barrier vapor adjacent to said surface.

3. The device of claim 1, wherein said semiconductor power device chip is a static induction transistor (SIT).

4. The device of claim 3, wherein the SIT is fabricated in a germanium chip.

5. The device of claim 1, wherein said semiconductor power device chip is a field-effect transistor (FET).

6. The device of claim 5, wherein said FET is a Metal-Oxide-Semiconductor FET (MOSFET).

7. The device of claim 1, wherein said substrate material is selected from the group consisting of beryllia, alumina, diamond and aluminum nitride.

8. The device of claim 1, wherein said semiconductor power device chip is fabricated from a material selected from the group consisting of silicon and gallium arsenide.

9. The device of claim 1, wherein the cryogenic fluid is liquid nitrogen (LN$_2$).

10. A device for use in a cryogenic environment, comprising:
    a semiconductor power device chip;
    a substrate having a surface on which said chip is mounted, said substrate being substantially surrounded by a mass of cryogenic fluid;
    said substrate consisting of an electrically and thermally conductive material having greater thermal conductivity at cryogenic temperatures than at room temperature;
    said substrate having a thickness selected for optimum dissipation, at cryogenic temperatures, of chip-generated heat, said last-recited thickness being greater than the substrate thickness selected for optimum heat dissipation for device operation at room temperature;
    an electrically insulative structural member disposed in said mass of cryogenic fluid substantially parallel to said substrate;
    means for increasing the heat dissipation of said substrate including a base portion connected between said substrate and said structural member for spacing said substrate from said structural member, said base portion being effective to increase the surface area of said substrate exposed to said cryogenic fluid.

11. The device of claim 10 wherein said base portion is electrically insulative.

12. The device of claim 10, wherein said substrate consists essentially of beryllium.

* * * * *